United States Patent [19]
Kim et al.

[11] Patent Number: 5,338,959
[45] Date of Patent: Aug. 16, 1994

[54] THIN FILM TRANSISTOR WITH THREE DIMENSIONAL MULTICHANNEL STRUCTURE

[75] Inventors: Weonkeun Kim, Incheon; Chulsoo Kim, Kyungki-do; Jeongin Han, Seoul, all of Rep. of Korea

[73] Assignee: Samsung Electronics Co., Ltd., Rep. of Korea

[21] Appl. No.: 40,016

[22] Filed: Mar. 30, 1993

[30] Foreign Application Priority Data

Mar. 30, 1992 [KR] Rep. of Korea ............... 92-5291
Jun. 27, 1992 [KR] Rep. of Korea ............. 92-11366
Jun. 27, 1992 [KR] Rep. of Korea ............. 92-11367

[51] Int. Cl.$^5$ ............................................ H01L 29/78
[52] U.S. Cl. ............................ 257/331; 257/365; 257/401; 257/66; 257/364
[58] Field of Search ............... 257/331, 365, 401, 66, 257/364

[56] References Cited

U.S. PATENT DOCUMENTS

4,996,574  2/1991  Shirasaki .......................... 257/66
5,140,391  8/1992  Hayashi et al. ................. 257/365

FOREIGN PATENT DOCUMENTS

7133677  8/1982  Japan .............................. 257/401
2287662  12/1987  Japan ............................. 257/365

OTHER PUBLICATIONS

Takashi Unagami, High-Voltage Poly-SI TFT'S with Multichannel Structure, IEEE Transactions on electron Devices, vol. 35, No. 12, Dec. 1988, pp. 2363-2366.
Akihiro Nitayama et al., Multi-Pillar Surrounding Gate Transistor (M-SGT) for Compact and High-Speed Circuits IEEE Transactions on Electronic Devices, vol. 38, No. 3, Mar. 1991, pp. 074P02-074P06.
Tanaka et al., Field-Induction-Drain (FID) Poly-SI TFTs with High On/Off Current Ratio, Extended Abstracts of the 22nd (1990 International) Conference on Solid State Devices and Materials Sendai, 1990, pp. 1011-1014.
S. S. Roth et al., Polysilicon Encapsulated Local Oxidation, IEEE Electron Device Letters, vol. 12, No. 3 Mar. 1991.

*Primary Examiner*—William L. Sikes
*Assistant Examiner*—Fetsum Abraham
*Attorney, Agent, or Firm*—Cushman, Darby & Cushman

[57] ABSTRACT

A thin film transistor gate structure with a three-dimensional multichannel structure is disclosed.

The thin film transistor gate structure according to the present invention comprises source/drain electrodes formed so as to be spaced from and opposite to each other on a substrate; semiconductive layers, comprised of a plurality of sub-semiconductive layers, each formed in a row, each end of the sub-semiconductive layers being in ohmic-contact with the source/drain electrodes; gate insulating layers surrounding each of the semiconductive layers; and gate electrodes surrounding each of the gate insulating layers.

Accordingly, the whole outerlayers of each sub-semiconductive layer surrounded by the gate electrodes serve as channel regions. As a result, the effective channel area increases, thereby improving the channel conductance and current driving ability.

10 Claims, 4 Drawing Sheets

THIN FILM TRANSISTOR WITH THREE DIMENSIONAL MULTICHANNEL STRUCTURE

BACKGROUND OF THE INVENTION (1) Field of the Invention

The present invention relates to a high-speed polycrystalline silicon thin-film transistor (TFT) with three dimensional multichannel structure. More particularly, it relates to a high-speed TFT having three dimensional multichannel structure of which every side of a polycrystalline silicon film used as a semiconductive layer in a channel region is surrounded by a gate, and which is useful to ultra large scale integration (ULSI) circuits requiring a high-speed performance.

(2) Description of the Prior Art

Thin-film transistors (TFT's) have been used as switching devices for very large scale integrated circuits such as flat-panel liquid-crystal displays, image sensors, copying machines, printers, scanners, etc.

In accordance with the progress in the new display monitors such as high definition televisions (HDTV), etc., much study has been devoted to developing flat panel displays. Liquid crystal displays (LCD's) are representative of flat panel displays. They have desirable coloring, power consumption, and performance characteristics compared to electroluminescences (EL), vacuum fluorescence displays (VFD), plasma displays (PDP), etc. These LCD's generally include passive type and active type LCD's. In active type LCD's, each pixel is controlled by active devices such as TFT's, and are superior to passive type LCD's with respect to speed, viewing angle, and contrast ratio. Thus, they are the most suitable displays for HDTV, in which the reproduced image contains more than one million elements.

Conventional single crystalline silicon field effect transistors (FET) are difficult to manufacture for large scale displays and they cannot be formed on an insulating substrate such as glass. Their use tends to be limited to memory devices, commercial integrated circuits, etc. Polysilicon thin film transistors, however, have wide application for flat panel displays and image sensors that cannot be embodied with single crystalline silicon field effect transistors.

A polycrystalline silicon thin film transistor manufacturing technique, using a polycrystalline silicon film as a semiconductor within channel regions, is suitable for ultra-high-density large scale integrated circuits requiring high voltage and high current. The poly-Si TFT's, however, have unacceptably high leakage current compared to FET's made on the crystalline silicon substrate. This is because very thin semiconductive films, several hundred angsttoms thick, are deposited on an insulating substrate in the TFT's, and electrons induced to the channel regions are diffused throughout the Si substrate (like the FET's in an OFF state of the gate) and are reunited to be absorbed in drains.

There is another problem in that carrier mobility in the channel region is low, and the magnitude of the driving current, i.e., $I_{ON}$, is small.

According to a conventional reverse staggered type TFT as shown in FIG. 1, a gate electrode 11 is formed on a substrate 10 made of an insulating material such as glass, and a gate insulating layer 12 is formed on the gate electrode 11. A semiconductive layer 13 is formed on the gate insulating layer 12 and ohmic contact layers 14 are formed on the right and left sides of the semiconductive layer 13, excluding a channel region. Finally, source/drain electrodes 15 are formed.

According to a conventional staggered type TFT as shown in FIG. 2, a gate electrode 25 is formed on a semiconductive layer 23, with a gate insulating layer 24 formed there between. Ohmic contact layers 22 are formed to the sides of the semiconductive layer 23 to be proximately aligned with the gate electrode 25. Source and drain electrodes 21 are formed on an insulating substrate 20.

The TFT having the conventional single gate electrode suffers from low channel conductance as well as the problems as mentioned above.

According to conventional technology, a double gate polycrystalline silicon metal oxide semiconductor FET (MOSFET) is proposed, having upper and lower gates and TFT with dual gate structure in which gates are formed side by side. The double gate structure is disclosed in pp. 393–396 of Extended Abstracts of 22nd Conference on SSDM, "Double-Gate Polysilicon MOSFET", published in 1990.

A side-sectional view of the double gate polycrystalline silicon MOSFET is shown in FIG. 3. The relation between gate voltage $V_c$ and transconductance $g_m$ according to gate structure is illustrated in FIG. 4.

As shown in FIG. 3, the MOSFET with double gate structure is formed as follows. A polycrystalline silicon film 33 is formed on a silicon substrate 30 on which an insulating layer 39 is deposited. Gate insulating layers 32 and 35 are interposed between a lower gate 31 and a upper gate 36. That is, each gate is formed on the lower and upper parts of a polycrystalline silicon film 33 used as a semiconductor channel region, such that the width of current passage from the source 34A to the drain 34B is twice as great as if only a single gate were used. A interlayer insulating layer 37 and a conductive layer for metallization 38 are also included. Accordingly, as depicted in FIG. 4, the transconductance $g_m$, increases about twice as much compared with the conventional single gate MOSFET.

In the double gate FET, however, if the required area decreases so as to increase integrity, the channel region also decreases, and therefore the channel conductance decreases as well.

In order to obtain the characteristics as mentioned above, the thickness of the polycrystalline silicon film 33 between the double gates must be limited to about 100 angstroms, which is a significant barrier in ULSI's requiring high voltage and high current. The impossibility of applying high voltage thereto is a drawback to the LCD's aiming for integration with their peripheral circuits.

The mechanism of polysilicon thin film transistors having high voltage and high transconductance formed on a quartz substrate by a multiple strip polysilicon film is disclosed by Takashi Unagami under a title of "High-Voltage PolySi TFT's with Multichannel Structure" at pp. 2363 to 2367 of VOL. 35, IEEE TRANSACTIONS ON ELECTRON DEVICE, published on December, 1988.

In the TFT with multichannel structure in the above-described paper, a gate electrode is disposed on only a single side of the channel region for each strip. Since each strip has just one side-channel structure, there is a problem that channel conductance and current driving ability cannot be maximized.

The reduction of the channel length and channel width of the planar transistor is very important in the development of ULSI's. The reduction of the channel length, however, causes serious problems such as degradation in hot carrier-induction characteristics and decrease in the threshold voltage due to short channel effects. In addition, the reduction of the channel width brings about degradation in hot carrier-induction characteristics and current driving ability because of a strong electric field at the field isolation edges. These problems give rise to scaling limitations of planar transistors for future ULSI's.

SUMMARY OF THE INVENTION

Accordingly, an object of the present invention is to provide an improved three dimensional multichannel TFT having large channel conductance to solve the problems mentioned above.

Another object of the present invention is to provide a method for making a three dimensional multichannel TFT useful for ULSI's requiring high driving current and for LCD's aiming at integration with peripheral circuits, by maximizing current passage of the channel region.

The TFT of this invention has a plurality of channel regions for high carrier mobility. Each channel region has three-dimensional structure. All sides of the channel regions, i.e., polycrystalline silicon layers, are surrounded by gates.

Thus, the effective channel regions (current passage) in a given area are greatly increased compared to conventional TFT's to give large channel conductance. As a result, the ON currents increase and the threshold voltage decreases.

DESCRIPTION OF THE PREFERRED EMBODIMENT

Figure 5:
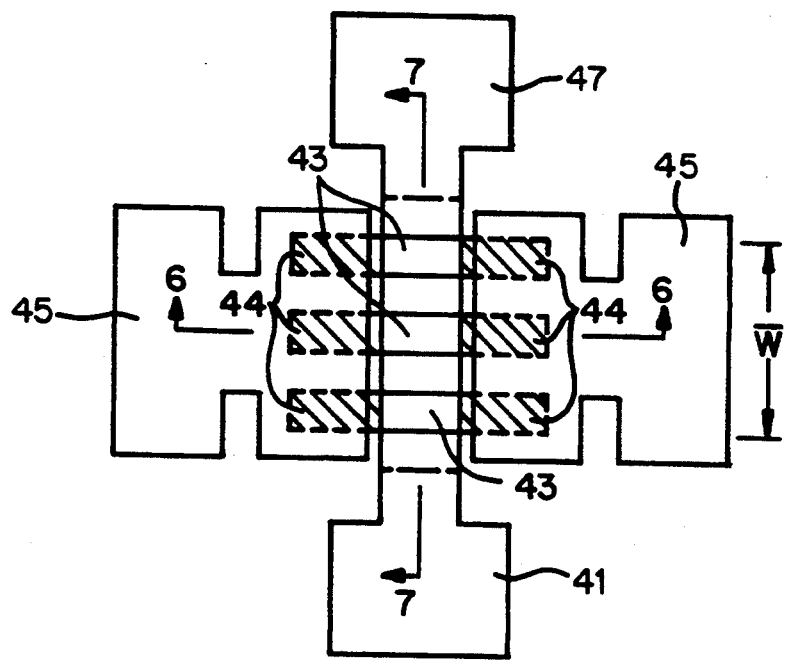
FIG. 5 is a plan view of a three dimensional multichannel TFT in accordance with a first preferred embodiment of this invention.
Figure 6:
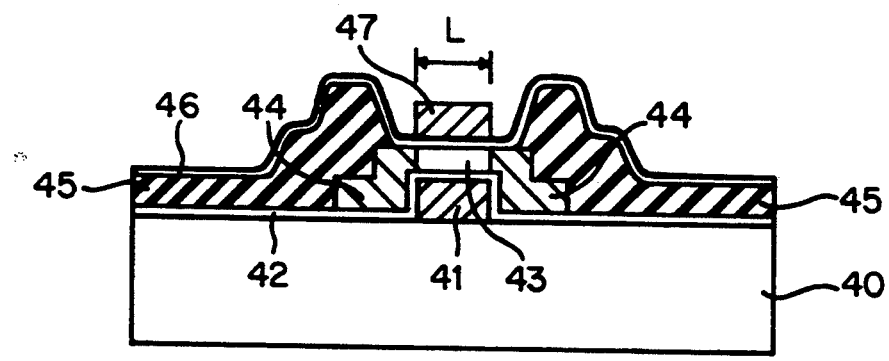
FIG. 6 is a side-sectional view of FIG, 5 as taken along line 6—6'.
Figure 7:
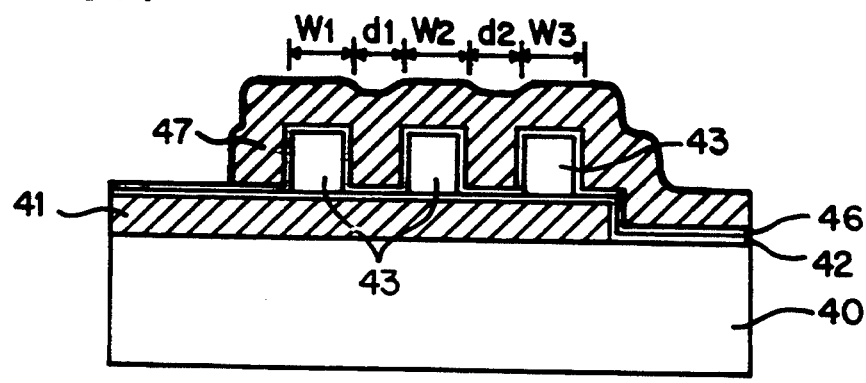
FIG. 7 is a side-sectional view of FIG, 5 as taken along line 7—7'.

FIG. 5 is a plan view of a three dimensional multichannel TFT in accordance with a first preferred embodiment of this invention, FIG. 6 is a side-sectional view of FIG, 5 as taken along line 6—6' and FIG. 7 is a side-sectional view of FIG, 5 taken along line 7—7'.

The reference numerals designate the following elements: a lower gate electrode 41; a plurality of single channel regions 43 which together form the entire channel for the multichannel TFT according to the present invention; source and drain regions 44A and 44B that are in ohmic contact with the source drain electrodes 45; source/drain electrodes 45; and an upper gate electrode 47. Reference numerals 90A and 90B are gate electrode contact portions which correspond to gate electrodes 41 and 47, respectively. The reference numerals 42 and 46 designate gate insulating layers.

Referring now to FIGS. 5 and 7, a TFT with three dimensional multichannel structure has a plurality of continuous contact-channel-contact strips separated from one another and having a gate electrode disposed substantially around the channel regions 43. Specifically, as shown in FIGS. 6 and 7, channel regions 43 are surrounded by the lower gate electrode 41 and the upper gate electrode 47. Since the gate electrodes 41 and 47 adjoin each channel region 43 in every direction about its cross-sectional periphery, large conductance can be thereby obtained. While gate electrodes 41 and 47 are not electrically connected in the embodiment described here, they may be connected in other embodiments of the present invention.

If, for example, the channel length and channel width are L and W, respectively, $I_{ON}$ current of TFT is proportional to the channel size A, and inversely proportional to the channel length L. The channel width multiplied by the channel thickness is the channel size A.

Figure 1:
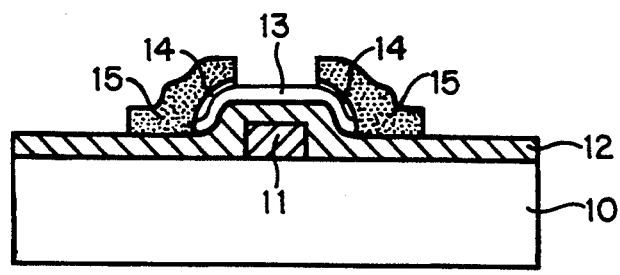
FIG. 1 is a side-sectional view of a first conventional reverse staggered type TFT.
Figure 2:
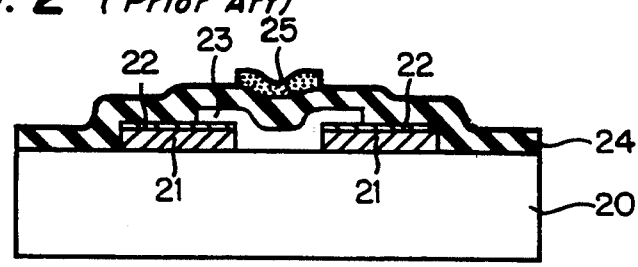
FIG. 2 is a side-sectional view of a second conventional staggered type TFT.

Accordingly, in the case of a single gate TFT as illustrated in FIG. 2, the relation is as follows: $I_{ON} \propto W$.

Figure 3:
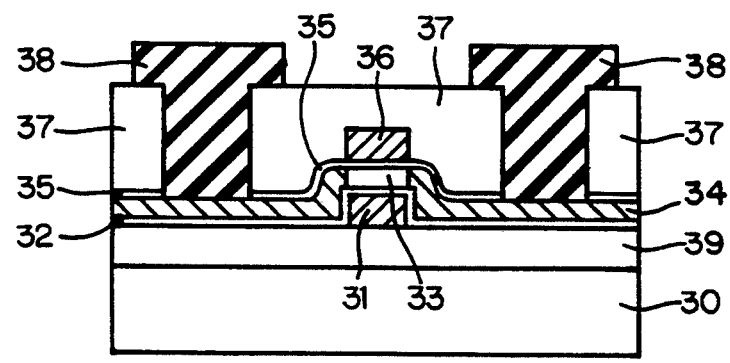
FIG. 3 is a side-sectional view of a conventional double gate MOSFET.
Figure 4:
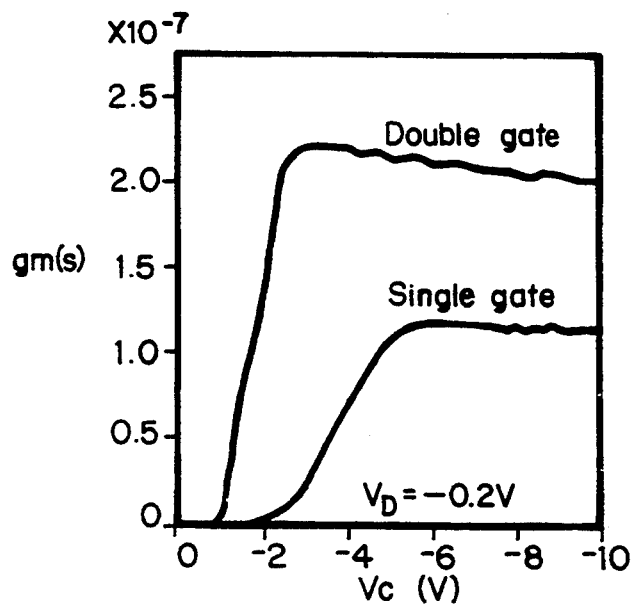
FIG. 4 graphically depicts the relation between the gate voltage and transconductance.

In the case of double gate TFT as illustrated in FIG. 3, $$I_{ON} \propto 2W$$

In the case of the three-dimensional n-channel TFT as illustrated in FIGS. 5-7, the entire channel width W has n channel strip sections, each having a width w and a distance d therebetween. If the thickness of each channel strip section is T, ON current $I_{ON}$ is as follows:

$$I_{ON} \propto (2w+2T)=n \qquad (1)$$

Hereupon, if the space d is the same as the thickness T, W equals $nw+(n-1)T$, and, therefore, the above expression (1) is:

$$I_{ON} \propto 2\,[nw+(n-1)T]+2T, \text{ so}$$

$$I_{ON} \propto 2W+2T$$

Accordingly, the ON currents of the three-dimensional multichannel TFT of this invention increase by an additional 2T, compared to those of the double gate TFT, and by an additional W+2T compared to those of the single gate TFT.

In the case of T>d, the ON current in the TFT in accordance with this invention greatly increases.

Therefore, since three-dimensional channel regions can be formed according to this invention, with the gate surrounding all sides of the channel, the higher comparative channel conductance is achieved in the same cross-sectional area (W×L), and the integrity per unit area can be improved, which contributes to the attainment of high quality visual reproduction in LCD's.

The case where the thickness T and width W is larger than the effective channel thickness t is described in the above preferred embodiment. The channel conductance increases even in a case where T, W, or T and W is as thin as the effective channel thickness t. The gate potential applied to the gate electrode is made by the voltage applied to the lower gate and the voltage applied to the upper gate, and thus, the ON currents increase because of the rising gate potential.

A second preferred embodiment of this invention is described in detail referring to FIG. 8 and FIGS. 9A to 9F.

Figure 8:
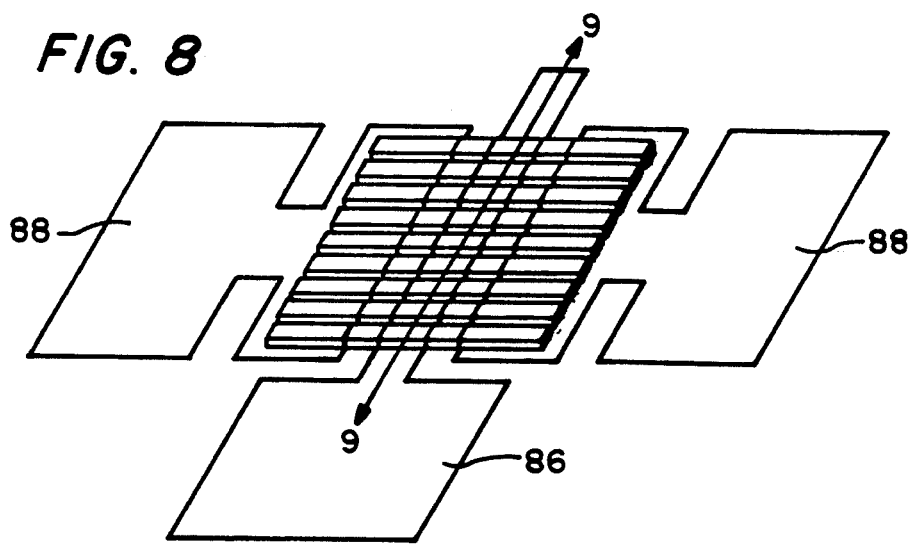
FIG. 8 is a perspective view of a three dimensional multichannel TFT in accordance with a second preferred embodiment of this invention.

FIG. 8 is a schematic perspective view of a three dimensional multichannel TFT in accordance with a second preferred embodiment of this invention.

The fundamental structure in the second preferred embodiment is identical with that in the first preferred embodiment appearing in FIG. 5. That is, the second embodiment provides a three-dimensional multichannel structure in which each channel 84 is surrounded by a gate 86 and gate insulating layers 85. A single gate is used in this second embodiment. The gate used in the first embodiment, however, is defined into upper and lower portions by gate insulating layers, as described above. Each channel contacts source and drain regions 88.

FIGS. 9A to 9F are partial side-sectional views illustrating the steps in the manufacture of a TFT according to the present invention described in FIG. 8 and taken along line 9—9'. A three-dimensional multichannel TFT having only two channels is shown for convenience in illustration.

Figure 9A:
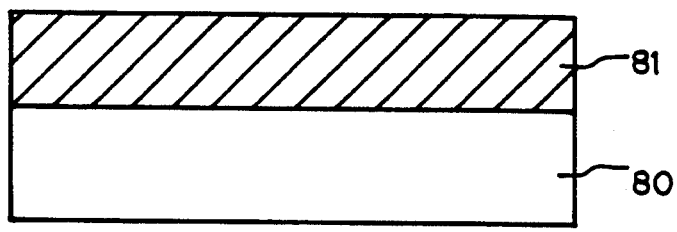
FIGS. 9A to 9F are side-sectional views for depicting the steps in the manufacture of a TFT as taken along line 9—9' of FIG. 8.

In FIG. 9A, a substrate 80 is selected from the group consisting of glass, quartz, amorphous or crystalline substrates. In particular, a substrate for an LCD is made from a material that will transmit light.

The manufacturing process begins by depositing a polycrystalline silicon layer 81 to a predetermined thickness on a glass substrate 80 by a low pressure chemical vapor deposition process (LPCVD). The deposited polycrystalline silicon layer 81 is a slightly doped with impurities to have conductivity, and acts as a gate layer.

Figure 9B:
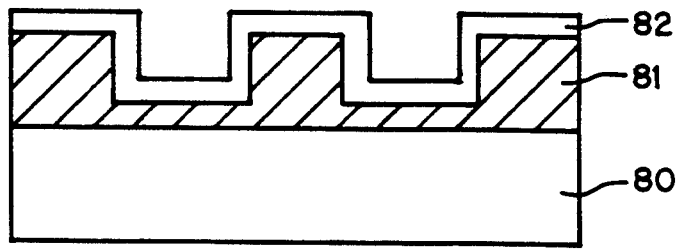

As seen from FIG. 9B, predetermined parts of the polycrystalline silicon layer 81 are etched by a conventional photoetching process to form a plurality of trenches where channel regions will be formed. These trenches are arranged in a row and are extended longitudinally (i.e., perpendicularly to line C—C'), and are formed by a reactive ion etching process. After that, the polycrystalline silicon layer 81 is thermally oxidized in order to form an insulating layer 82. The thermal oxidation is carried out at 1000° C. in an ambient of dry $O_2$. The insulating layer 82 is $SiO_2$ having a thickness of about 0.1 μm.

Figure 9C:
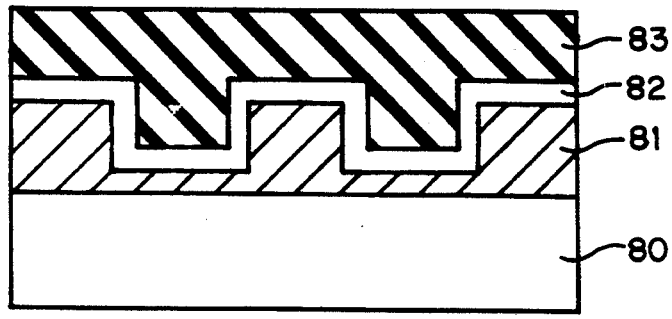

Subsequently, a second polycrystalline silicon layer 83 is deposited on the surface of insulating layer 82 by LPCVD as shown in FIG. 9C.

Figure 9D:
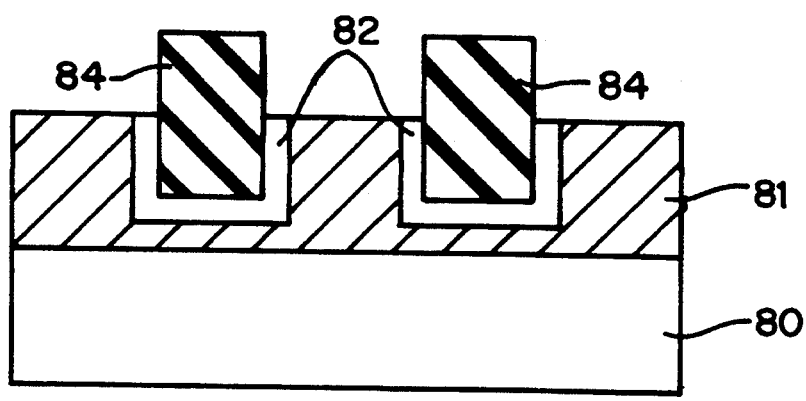

As seen from FIG. 9D, parts of the polycrystalline silicon layer 83 and insulating layer 82 are removed by a photoetching process to define a plurality of channel regions 84 spaced apart from each other. That is, the polycrystalline silicon layer 83 is removed except for the channel regions.

Figure 9E:
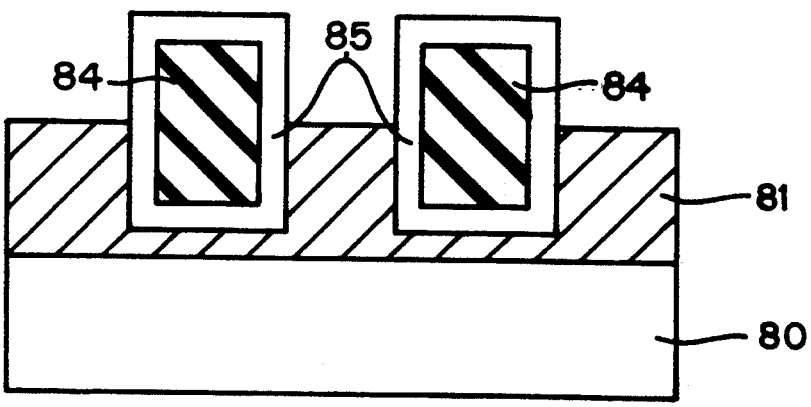

After the formation of the channel regions 84, the polycrystalline silicon layer forming the channel regions 84 is thermally oxidized to a depth of 0.1 μm, as seen in FIG. 9E. Photo-etching is then performed on the insulating layer 82, except for the insulating layer surrounding the channel regions 84, to form gate insulating layers 85 entirely surrounding the channel regions 84, as seen in FIG. 9E.

Figure 9F:
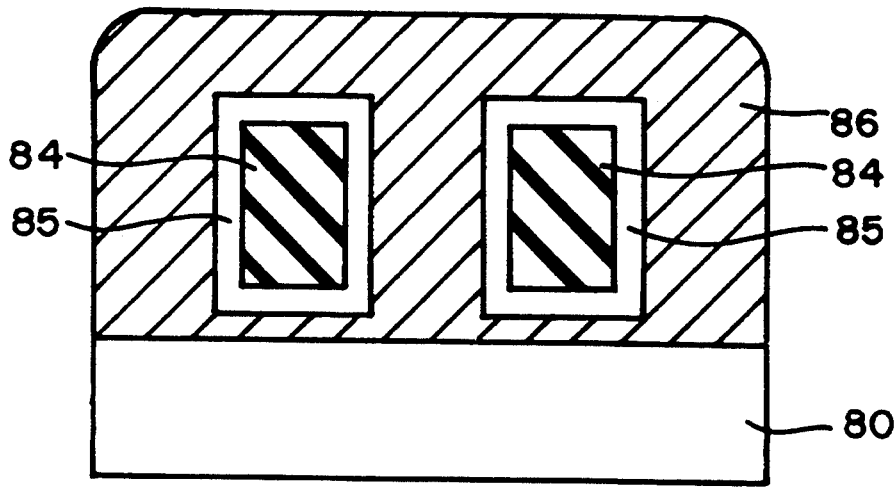

As seen from FIG. 9F, a third polycrystalline silicon layer doped with impurities is deposited on the polycrystalline silicon layer 81 such that a gate electrode 86 entirely surrounding the channel regions 84 is formed.

The third polycrystalline silicon layer which is so deposited is identical in composition (e.g., with respect to doping, etc.) to polycrystalline silicon layer 81.

In order to complete the formation of the structure as shown in FIG. 8, source/drain regions 88 are formed which are in ohmic contact with each channel region 84.

According to the manufacturing as described above, the TFT with three-dimensional multichannel structure is thus formed.

The method for making TFT's with three-dimensional multichannel structure is not limited to the above embodiments. For example, in a case where the upper and lower gates are separated by the gate insulating layer as in the first preferred embodiment, an etching process to isolate the gate insulating layer to one by one at every channel may be omitted. Many variations and/or modifications of the basic inventive concepts taught herein will still fall within the spirit and scope of the present invention. For example, the sectional structure of the channel regions can be made in any form, such as rectangular, regular square, circular, etc.

The TFT with three-dimensional multichannel structure of this invention has greatly improved current driving ability, and can be applied to peripheral circuits such as column drivers requiring large ON currents as well as switching elements for LCD's.

We claim:

1. A thin film transistor gate structure comprising:
   (a) a substrate;
   (b) a plurality of spaced apart semiconductive strips formed substantially parallel to one another and to said substrate, each said strip having a channel portion;
   (c) a gate insulating layer surrounding a cross-sectional periphery of each said channel portion of each said semiconductive strip; and
   (d) a gate electrode surrounding said gate insulating layer, a portion of said gate electrode being disposed on said substrate.

2. A thin film transistor gate structure as set forth in claim 1, wherein said gate electrode comprises upper and lower electrode portions.

3. A thin film transistor gate structure as set forth in claim 2, wherein said gate insulating layer comprises upper and lower insulating portions.

4. A thin film transistor gate structure as set forth in claim 1, wherein a cross-section of each said semiconductive strip is polygonal.

5. A thin film transistor gate structure as set forth in claim 1, wherein a cross-section of each said semiconductive strip channel portion is substantially circular.

6. A thin film transistor gate structure as set forth in claim 1, wherein a thickness of each said semiconductive strip channel portion is thicker than an effective channel thickness of the transistor.

7. The thin film transistor gate structure as set forth in claim 1, wherein the thickness of each said semiconductive strip channel portion is equal to an effective channel thickness of the transistor.

8. The thin film transistor gate structure as set forth in claim 1, wherein said semiconductive strips are formed of polycrystalline silicon.

9. The thin film transistor gate structure as set forth in claim 1, wherein said substrate is made from a material through which light can be transmitted.

10. A thin film transistor gate structure as set forth in claim 1, wherein said substrate is made from a material selected from the group consisting of glass, quartz, amorphous, silicon, or crystalline silicon.

* * * * *